US012765233B2

(12) United States Patent
Lee et al.

(10) Patent No.: US 12,765,233 B2
(45) Date of Patent: Oct. 13, 2026

(54) DISPLAY DEVICE

(71) Applicant: Samsung Display Co., LTD., Yongin-si (KR)

(72) Inventors: Sungkook Lee, Yongin-si (KR); Youngsu Kim, Yongin-si (KR); Jisoo Kim, Yongin-si (KR); Dongjin Park, Yongin-si (KR); Cheuljin Park, Yongin-si (KR); Kisang Yoo, Yongin-si (KR); Kyoungah Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 290 days.

(21) Appl. No.: 18/382,330

(22) Filed: Oct. 20, 2023

(65) Prior Publication Data

US 2024/0237490 A1 Jul. 11, 2024

(30) Foreign Application Priority Data

Jan. 10, 2023 (KR) ........................ 10-2023-0003331

(51) Int. Cl.
*H10K 59/80* (2023.01)

(52) U.S. Cl.
CPC .................................. *H10K 59/873* (2023.02)

(58) Field of Classification Search
None
See application file for complete search history.

(56) References Cited

U.S. PATENT DOCUMENTS

| | | | | |
|---|---|---|---|---|
| 12,295,244 | B2 * | 5/2025 | Kuon | H10K 71/00 |
| 2016/0324018 | A1 * | 11/2016 | Choi | G06F 1/1652 |
| 2021/0127517 | A1 * | 4/2021 | Kim | H05K 5/03 |
| 2022/0005877 | A1 * | 1/2022 | Seo | H10K 59/40 |
| 2024/0407217 | A1 * | 12/2024 | Wang | H10K 59/1315 |

FOREIGN PATENT DOCUMENTS

| | | | |
|---|---|---|---|
| KR | 1020150093191 | A | 8/2015 |
| KR | 101679550 | B1 | 12/2016 |
| KR | 1020210048615 | A | 5/2021 |
| KR | 102399741 | B1 | 5/2022 |

* cited by examiner

*Primary Examiner* — Michelle Mandala
(74) *Attorney, Agent, or Firm* — CANTOR COLBURN LLP

(57) ABSTRACT

A display device includes: a display panel including a front area having a flat surface, side areas having curved surfaces, and corner areas located between two adjacent side areas among the side areas, respectively; and a first transparent layer disposed on the display panel and including a flat surface on the front area and a curved surface on each of the side areas, where the first transparent layer has a thickness on each of the side areas different from a thickness on the front area.

19 Claims, 11 Drawing Sheets

DISPLAY DEVICE

This application claims priority to Korean Patent Application No. 10-2023-0003331, filed on Jan. 10, 2023, and all the benefits accruing therefrom under 35 U.S.C. § 119, the content of which in its entirety is herein incorporated by reference.

BACKGROUND

1. Technical Field

Embodiments relate to a display device. More particularly, embodiments relate to a display device including a curved surface.

2. Description of the Related Art

A display device is a device that displays an image for providing visual information to a user. Among display devices, an organic light emitting diode display has recently attracted attention.

The display device may include a window capable of transmitting light, a display panel disposed under the window to emit light, and a protective film attached to a lower part of the display panel to protect the display panel. In the past, a display panel consisting of only a flat surface has been used, but recently, a display panel including various curved surfaces has been used. Typically, such a display device is manufactured by attaching a display panel to a lower part of the window.

The display panel may include multiple curved surfaces and a corner (e.g., located adjacent to edge of the display panel) located between two adjacent curved surfaces among multiple curved surfaces. Cracks, buckling, or wrinkling can occur when the corner of the display panel is attached to the window. Accordingly, the display quality of the display device may be deteriorated

SUMMARY

Embodiments provide a display device with improved display quality.

A display device according to an embodiment includes: a display panel including a front area having a flat surface, side areas having curved surfaces, and corner areas located between two adjacent side areas among the side areas, respectively; and a first transparent layer disposed on the display panel and including a flat surface on the front area and a curved surface on each of the side areas, where the first transparent layer has a thickness on each of the side areas different from a thickness on the front area.

In an embodiment, the thickness of the first transparent layer on each of the side areas may gradually decrease away from a boundary of the first transparent layer between each of the side areas and the front area.

In an embodiment, the first transparent layer may include a cured resin.

In an embodiment, the first transparent layer may include at least one selected from a group consisting of a polyvinyl alcohol ("PVA")-based resin, polyacrylic acid, polyacrylamide, and a methylated melamine resin.

In an embodiment, a double curvature of the display panel in each of the corner areas may be about equal to or greater than 400 micrometers (μm) and equal to or less than about 1000 micrometers.

In an embodiment, the display device may further include a protective film disposed under the display panel and including a flat surface under the front area and a curved surface under each of the side areas.

In an embodiment, the display device may further include a first adhesive layer disposed between the protective film and the display panel and including a flat surface under the front area and a curved surface under each of the side areas.

In an embodiment, the display device may further include a window disposed on the first transparent layer and including a flat surface on the front area and a curved surface on each of the side areas.

In an embodiment, the display device may further include a second adhesive layer disposed between the first transparent layer and the window and including a flat surface on the front area and a curved surface on each of the side areas.

In an embodiment, the thickness of the first transparent layer on the front area may be equal to or greater than about 30 micrometers and equal to or less than about 180 micrometers.

In an embodiment, the first transparent layer may have a modulus equal to or greater than about 1 gigapascal (Gpa) and equal to or less than about 5 gigapascals.

In an embodiment, the display device may further include a second transparent layer disposed on the first transparent layer and including a flat surface on the front area a curved surface on each of the side areas, and the second transparent layer may have a thickness on each of the side areas different from a thickness on the front area.

In an embodiment, the thickness of the second transparent layer on each of the side areas may gradually decrease in a direction away from a boundary of the second transparent layer between each of the side areas and the front area.

In an embodiment, the second transparent layer may include a cured resin.

In an embodiment, the second transparent layer may include at least one selected from a group consisting of a polyvinyl alcohol (PVA)-based resin, polyacrylic acid, polyacrylamide, and a methylated melamine resin.

In an embodiment, the second transparent layer may have a modulus equal to or greater than about 1 gigapascal (Gpa) and equal to or less than about 5 gigapascals.

In an embodiment, the thickness of the second transparent layer on the front area may be different from the thickness of the first transparent layer on the front area.

In an embodiment, the thickness of the second transparent layer on the front area may be smaller than the thickness of the first transparent layer on the front area.

In an embodiment, the display device may further include a third transparent layer disposed on the second transparent layer and including a flat surface on the front area and a curved surface on each of the side areas, and the third transparent layer may have a thickness on each of the side areas different from a thickness on the front area.

In an embodiment, the thickness of the third transparent layer on each of the side areas may gradually decrease in a direction away from a boundary of the third transparent layer between each of the side areas and the front area.

A display device according to an embodiment may include a display panel including a front area with a flat surface, side areas with curved surfaces, and corner areas located between two adjacent side areas among the side areas, respectively, and a first transparent layer disposed on the display panel and including a flat surface on the front area.

Accordingly, when the display panel with a high curvature is attached to lower part of the window, buckling or cracks may not occur in the corner of the display device.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
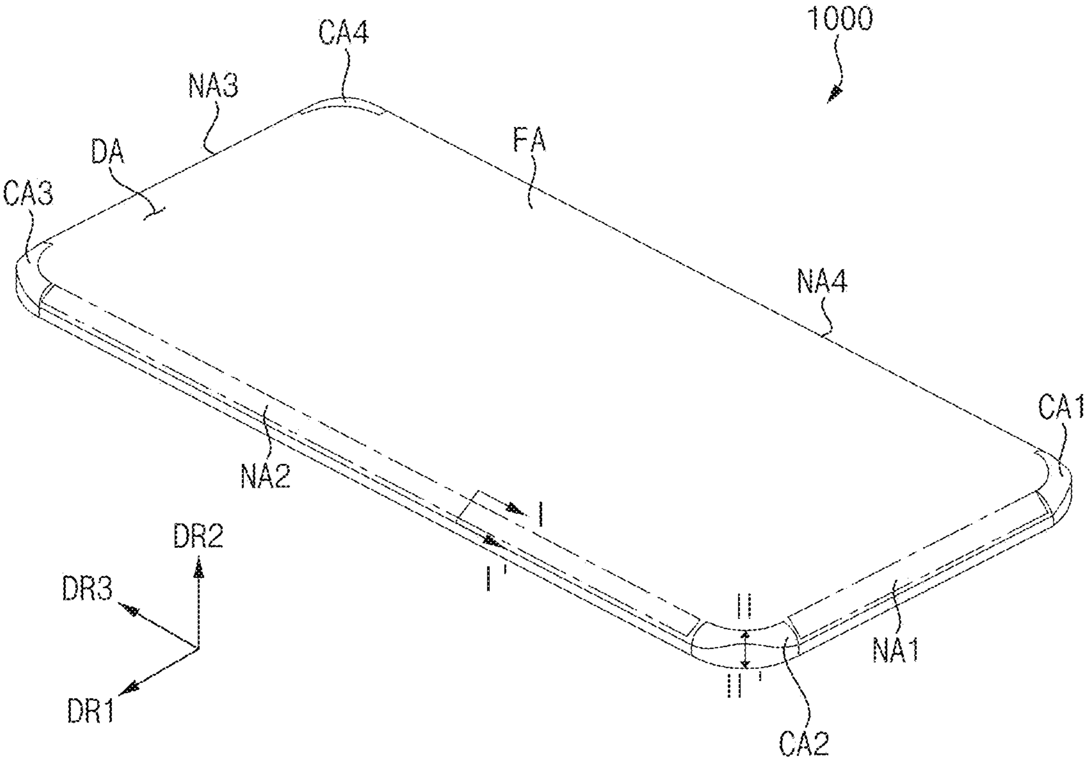
FIG. 1 is a schematic perspective view illustrating a display device according to an embodiment.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Hereinafter, display devices in accordance with embodiments will be described in more detail with reference to the accompanying drawings. The same reference numerals are used for the same components in the drawings, and redundant descriptions of the same components will be omitted.

FIG. 1 is a schematic perspective view illustrating a display device according to an embodiment.

Referring to FIG. 1, a display device 1000 may include a display area DA and a non-display area. The display area DA may be an area capable of displaying an image by emitting light.

The display area DA may include a front area FA, side areas NA1, NA2, NA3, and NA4, and corner areas CA1, CA2, CA3, and CA4 located between two adjacent side areas of the side areas NA1, NA2, NA3, and NA4, respectively.

That is, the first corner area CA1 may be disposed between the fourth side area NA4 and the first side area NA1. In addition, a second corner area CA2 may be disposed between the first side area NA1 and the second side area NA2. In addition, a third corner area CA3 may be disposed between the second side area NA2 and the third side area NA3. In addition, a fourth corner area CA4 may be disposed between the third side area NA3 and the fourth side area NA4.

The display device 1000 may have a flat surface in the front area FA, and may have curved surfaces in the side areas NA1, NA2, NA3, and NA4 and the corner areas CA1, CA2, CA3, and CA4.

The non-display area is an area that does not emit light and may include a driving unit for driving the display area DA. For example, the driving unit may include a data driving unit, a gate driving unit, or the like.

Figure 2:
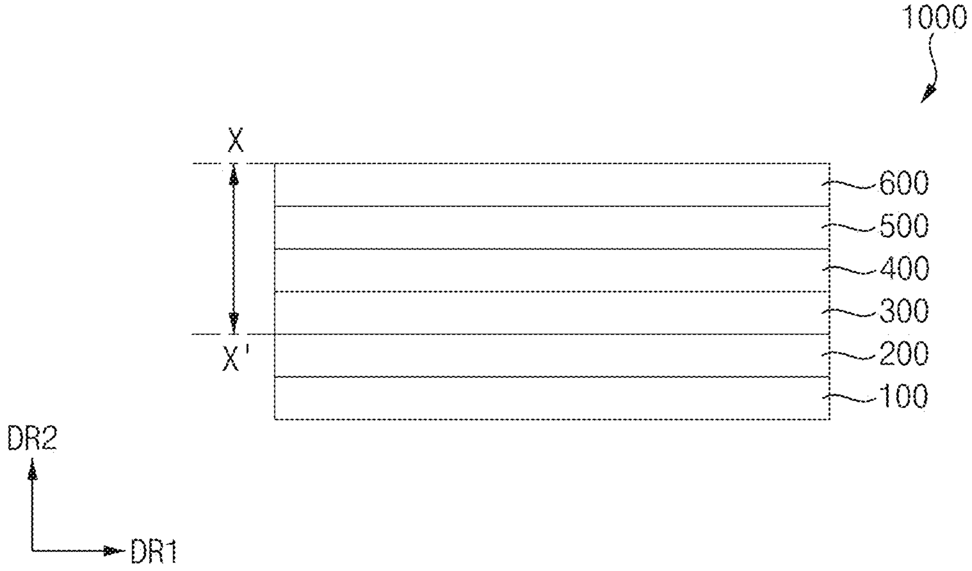
FIG. 2 is a view schematically illustrating a structure of the display device according to FIG. 1.
Figure 3:
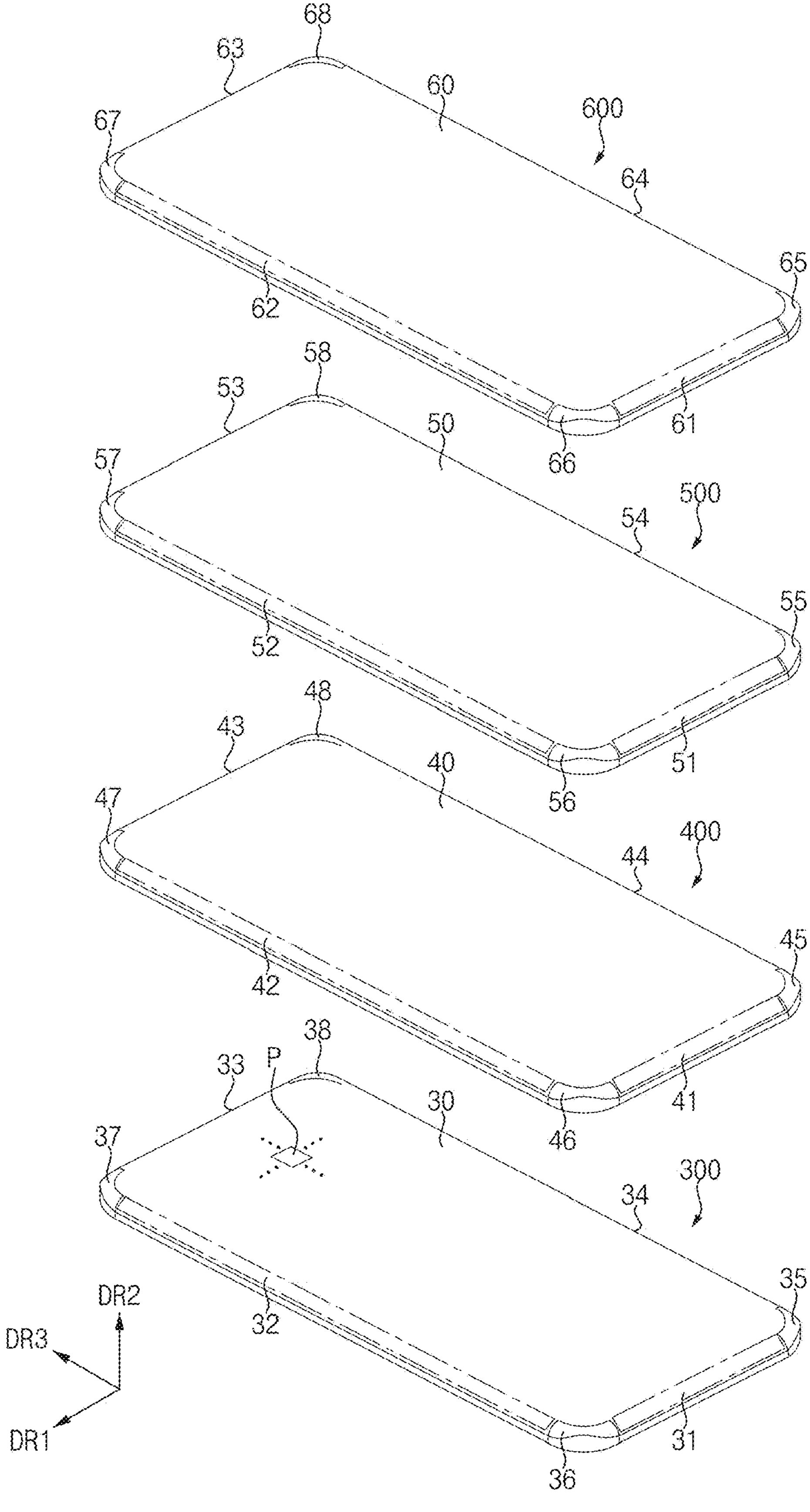
FIG. 3 is an schematic exploded perspective view of an X-X' portion of the display device shown in FIG. 2.

FIG. 2 is a view schematically illustrating a structure of the display device according to FIG. 1. FIG. 3 is an schematic exploded perspective view of an X-X' portion of the display device shown in FIG. 2.

Referring to FIG. 2, the display area DA of the display device 1000 may include a window 600, a second adhesive layer 500, a transparent layer 400, a display panel 300, a first adhesive layer 200, and a protective film 100.

The window 600 may transmit light emitted from the display panel 300. The window 600 may include an insulating material such as transparent plastic or glass. The window 600 may be attached to the transparent layer 400 through the second adhesive layer 500. The window 600 may include curved surfaces in some areas (e.g., the side areas NA1, NA2, NA3, and NA4 or the corner areas CA1, CA2, CA3, and CA4 of FIG. 1).

The second adhesive layer 500 may be disposed under the window 600. The second adhesive layer 500 may include an optical clear adhesive ("OCA"), an optical clear resin ("OCR"), or a pressure sensitive adhesive ("PSA"). The second adhesive layer 500 may transmit light. The second adhesive layer 500 may be disposed below the window 600 to provide an adhesive force to the window 600. The second adhesive layer 500 may include curved surfaces in some areas (e.g., the side areas NA1, NA2, NA3, and NA4 or the corner areas CA1, CA2, CA3, and CA4 of FIG. 1).

The transparent layer 400 may be disposed under the second adhesive layer 500. The transparent layer 400 may transmit light emitted from the display panel 300. In an embodiment, the transparent layer 400 may include a cured resin. For example, the transparent layer 400 may include a polyvinyl alcohol ("PVA")-based resin, polyacrylic acid, polyacrylamide, methylated melamine resin, or the like. These materials may be used alone or in combination with each other. However, the disclosure is not limited thereto, and the transparent layer 400 may include other kinds of curing resins. The transparent layer 400 may include curved surfaces in some areas (e.g., the side areas NA1, NA2, NA3, and NA4 or the corner areas CA1, CA2, CA3, and CA4 of FIG. 1).

The display panel 300 may be disposed under the transparent layer 400. The display panel 300 may include a plurality of display units (e.g., display unit P of FIG. 3). Each of the plurality of display units may emit light. The display panel 300 may include curved surfaces in some areas (e.g., the side areas NA1, NA2, NA3, and NA4 or the corner areas CA1, CA2, CA3, and CA4 of FIG. 1).

The first adhesive layer 200 may be disposed under the display panel 300. The first adhesive layer 200 may include OCA, OCR, or PSA. The first adhesive layer 200 may be disposed below the display panel 300 to provide adhesive force to the display panel 300. The first adhesive layer 200 may include curved surfaces in some areas (e.g., the side areas NA1, NA2, NA3, and NA4 or the corner areas CA1, CA2, CA3, and CA4 of FIG. 1).

The protective film 100 may be disposed under the first adhesive layer 200. The protective film 100 may protect a lower surface of the display panel 300. In an embodiment, the protective film 100 may include a cured resin. For example, the cured resin may include an acrylic resin, an epoxy resin, or the like. The protective film 100 may include curved surfaces in some areas (e.g., the side areas NA1, NA2, NA3, and NA4 or the corner areas CA1, CA2, CA3, and CA4 of FIG. 1).

The first direction DR1 and the second direction DR2 intersecting the first direction may be defined. In addition, a third direction DR3 perpendicular to a plane formed by the first direction DR1 and the second direction DR2 may be defined.

Referring to FIGS. 1 and 3, the window 600 may include a window front part 60 in a portion overlapping the front area FA of the display device 1000. The window front part 60 may include a plane defined by the first direction DR1 and the third direction DR3. The window front part 60 may be perpendicular to the second direction DR2.

The window 600 may further include a first window side part 61 in a portion overlapping the first side area NA1 of the display device 1000. The first window side part 61 may be adjacent to the window front part 60 in a direction opposite to the third direction DR3. The first window side part 61 may be bent from the window front part 60.

The window 600 may further include a second window side part 62 in a portion overlapping the second side area NA2 of the display device 1000. The second window side part 62 may be adjacent to the window front part 60 in the first direction DR1. The second window side part 62 may be bent from the window front part 60.

The window 600 may further include a third window side part 63 in a portion overlapping the third side area NA3 of the display device 1000. The third window side part 63 may adjacent to the window front part 60 in the third direction DR3. The third window side part 63 may be bent from the window front part 60.

The window 600 may further include a fourth window side part 64 in a portion overlapping the fourth side area NA4 of the display device 1000. The fourth window side part 64 may be adjacent to the window front part 60 in a direction opposite to the first direction DR1. The fourth window side part 64 may be bent from the window front part 60.

Each of the first window side part 61, the second window side part 62, the third window side part 63, and the fourth window side part 64 may be bent at a predetermined curvature from the window front part 60. In an embodiment, each of the first window side part 61, the second window side part 62, the third window side part 63, and the fourth window side part 64 may be bent from the window front part 60 with the same curvature. However, the disclosure is not limited thereto. For example, the first and third window side parts 61 and 63 may have the same curvature, the second and fourth window side parts 62 and 64 may have the same curvature, and the first and third window side parts 61 and 63 may have different curvature from the second and fourth window side parts 62, 64.

The window 600 may further include a first window corner part 65 in a portion overlapping the first corner area CAL of the display device 1000. The first window corner part 65 may be disposed between the first window side part 61 and the fourth window side part 64. The first window corner part 65 may be bent as the first window side part 61 and the fourth window side part 64 are bent from the window front part 60.

The window 600 may further include a second window corner part 66 in a portion overlapping the second corner area CA2 of the display device 1000. The second window corner part 66 may be disposed between the first window side part 61 and the second window side part 62. The second window corner part 66 may be bent as the first window side part 61 and the second window side part 62 are bent from the window front part 60.

The window 600 may further include a third window corner part 67 in a portion overlapping the third corner area CA3 of the display device 1000. The third window corner part 67 may be disposed between the second window side part 62 and the third window side part 63. The third window corner part 67 may be bent as the second window side part 62 and the third window side part 63 are bent from the window front part 60.

The window 600 may further include a fourth window corner part 68 in a portion overlapping the fourth corner area CA4 of the display device 1000. The fourth window corner part 68 may be disposed between the third window side part 63 and the fourth window side part 64. The fourth window corner part 68 may be bent as the third window side part 63 and the fourth window side part 64 are bent from the window front part 60.

Each of the first window corner part 65, the second window corner part 66, the third window corner part 67, and the fourth window corner part 68 may have two or more curvature depending on a direction of a cut line making a cross-section. That is, two or more curvatures may overlap (i.e., cross) in each of the first window corner part 65, the second window corner part 66, the third window corner part 67, and the fourth window corner part 68. In this way, an area where two or more curvatures overlaps may be defined as a "double curved area". Curvature in the double curved area may be defined as a "double curvature".

Although the window 600 was described with reference to FIG. 3, the disclosure is not limited thereto, and the second adhesive layer 500, the transparent layer 400, the display panel 300, the first adhesive layer 200, and the protective film 100 of FIG. 2 may also be configured as window 600.

For example, the second adhesive layer 500 may include a second adhesive layer's front part 50, a second adhesive layer's first side part 51, a second adhesive layer's second side part 52, a second adhesive layer's third side part 53, a second adhesive layer's fourth side part 54, a second adhesive layer's first corner part 55, a second adhesive layer's second corner part 56, a second adhesive layer's third corner part 57, and a second adhesive layer's fourth corner part 58 at positions of the corresponding configurations of the window 600.

In addition, the first transparent layer 400 may include a first transparent layer's front part 40, a first transparent layer's first side part 41, a first transparent layer's second side part 42, a first transparent layer's third side part 43, a first transparent layer's fourth side part 44, a first transparent layer's first corner part 45, a first transparent layer's second corner part 46, a first transparent layer's third corner part 47, and a first transparent layer's fourth corner part 48 at positions of the corresponding configurations of the window 600.

In addition, the display panel 300 may include a panel front part 30, a first panel side part 31, a second panel side part 32, a third panel side part 33, a fourth panel side part 34, a first panel corner part 35, a second panel corner part 36, a third panel corner part 37, and a fourth panel corner part 38 at positions of the corresponding configurations of the window 600.

In addition, the first adhesive layer 200 of FIG. 2 may include a first adhesive layer's front part, a first adhesive layer's first side part, a first adhesive layer's second side part, a first adhesive layer's third side part, a first adhesive layer's fourth side part, a first adhesive layer's first corner part, a first adhesive layer's second corner part, a first adhesive layer's third corner part, and a first adhesive layer's fourth corner part at positions of the corresponding configurations of the window 600.

Figure 4:
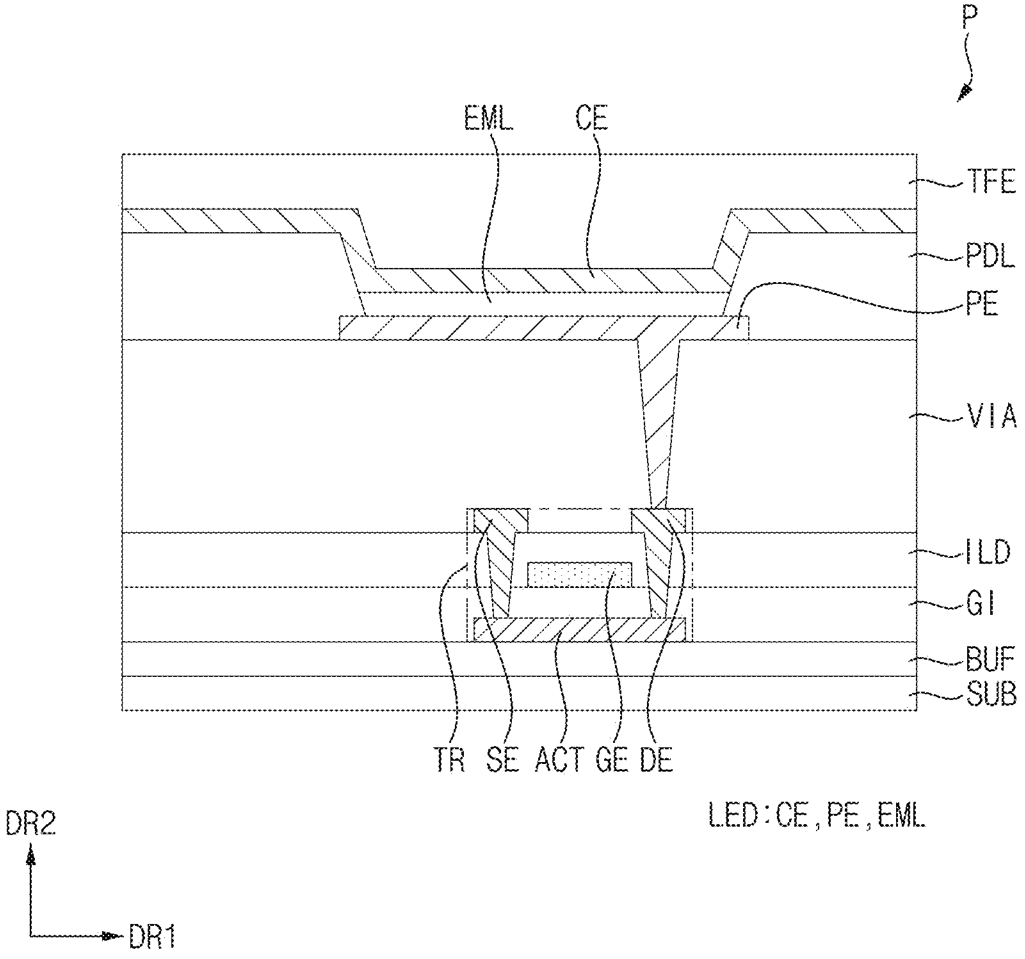
FIG. 4 is a schematic cross-sectional view illustrating a display unit included in a display panel of FIG. 3.

FIG. 4 is a schematic cross-sectional view illustrating a display unit included in a display panel of FIG. 3.

Referring to FIG. 4, a display unit p may include a substrate SUB, a buffer layer BUF, a gate insulating layer GI, an interlayer insulating layer ILD, a via insulating layer VIA, an active layer ACT, a source electrode SE, a gate electrode GE, a drain electrode DE, a pixel electrode PE, a pixel defining layer PDL, a light emitting layer EML, a common electrode CE, and an encapsulating layer TFE.

A transistor TR may include the active layer ACT, the source electrode SE, the gate electrode GE, and the drain electrode DE.

The substrate SUB may include a transparent material or an opaque material. The substrate SUB may be formed of a transparent resin substrate. Example of the transparent resin substrate may include a polyimide substrate. In this case, the polyimide substrate may include a first organic layer, a first barrier layer, a second organic layer, and the like.

Alternatively, the substrate SUB may include a quartz substrate, a synthetic quartz substrate, a calcium fluoride substrate, a fluorine-doped quartz substrate, a soda lime substrate, a non-alkali glass substrate, and the like. These materials may be used alone or in combination with each other.

The buffer layer BUF may be disposed on the substrate SUB. The buffer layer BUF may prevent metal atoms or impurities from diffusing from the substrate SUB to the transistor TR. In addition, the buffer layer BUF can improve the flatness of a surface of the substrate SUB when the surface of the substrate SUB is not uniform.

For example, the buffer layer BUF may include an inorganic material such as silicon oxide, silicon nitride, silicon oxynitride, and the like. These materials may be used alone or in combination with each other.

The active layer ACT may be disposed on the buffer layer BUF. The active layer ACT may include a metal oxide semiconductor, an inorganic semiconductor (e.g., amorphous silicon, polysilicon), an organic semiconductor, and the like. These materials may be used alone or in combination with each other. The active layer ACT may include a source area, a drain area, and a channel area disposed between the source area and the drain area.

The metal oxide semiconductor may include a binary compound ("$AB_x$"), a ternary compound ("$AB_xC_y$"), a tetragonal compound ("$AB_xC_yD_z$"), and the like including indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and the like.

For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), and indium gallium zinc oxide ("IGZO"). These materials may be used alone or in combination with each other.

The gate insulating layer GI may be disposed on the buffer layer BUF. The gate insulating layer GI may sufficiently cover the active layer ACT, and may have a substantially flat upper surface without generating a step around the active layer ACT. Alternatively, the gate insulating layer GI may cover the active layer ACT and may be disposed along a profile of the active layer ACT.

For example, the gate insulating layer GI may include inorganic materials such as silicon oxide ("$SiO_x$"), silicon nitride ("$SiN_x$"), silicon carbide ("$SiC_x$"), silicon oxynitride ("$SiO_xN_y$"), silicon oxycarbide ("$SiO_xC_y$"), and the like. These materials may be used alone or in combination with each other.

The gate electrode GE may be disposed on the gate insulating layer GI. The gate electrode GE may overlap the channel area of the active layer ACT.

The gate electrode GE may include a metal, an alloy metal nitride, a conductive metal oxide, a transparent conductive material, or the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), or the like. Examples of the conductive metal oxide may include Indium tin oxide, indium zinc oxide, or the like. In addition, examples of the metal nitride may include aluminum nitride ("$AlN_x$"), tungsten nitride ("$WN_x$"), chromium nitride ("$CrN_x$"), or the like. Each of these materials may be used alone or in combination with each other.

The interlayer insulating layer ILD may be disposed on the gate insulating layer GI. The interlayer insulating layer ILD may sufficiently cover the gate electrode GE, and may have a substantially flat upper surface without generating a step around the gate electrode GE. Alternatively, the interlayer insulating layer ILD may cover the gate electrode GE, and may be disposed along a profile of the gate electrode GE.

For example, the interlayer insulating layer ILD may include inorganic materials such as silicon oxide, silicon nitride, silicon carbide, silicon oxynitride, silicon oxycarbide, or the like. These materials may be used alone or in combination with each other.

The source electrode SE may be disposed on the interlayer insulating layer ILD. The source electrode SE may be connected to the source area of the active layer ACT through a contact hole penetrating the gate insulating layer GI and the interlayer insulating layer ILD.

The drain electrode DE may be disposed on the interlayer insulating layer ILD. The drain electrode DE may be connected to the drain area of the active layer ACT through a contact hole penetrating the gate insulating layer GI and the interlayer insulating layer ILD.

For example, the source electrode SE may include a metal, an alloy, a metal nitride, a conductive metal oxide, a transparent conductive material, and the like. These materials may be used alone or in combination with each other. The drain electrode DE may be formed through the same process as the source electrode SE and may include the same material as the source electrode SE.

The via insulating layer VIA may be disposed on the interlayer insulating layer ILD. The via insulating layer VIA may sufficiently cover the source electrode SE and the drain electrode DE. The via insulating layer VIA may include an organic material. For example, the via insulating layer VIA may include organic materials such as phenolic resin, acrylic resin, polyimide resin, polyamide resin, siloxane resin, epoxy resin, and the like. These materials may be used alone or in combination with each other.

The pixel electrode PE may be disposed on the via insulating layer VIA. The pixel electrode PE may be connected to the drain electrode DE through a contact hole penetrating the via insulating layer VIA.

The pixel electrode PE may include a metal, an alloy, a metal nitride, a conductive metal oxide, a transparent conductive material, and the like. These materials be used alone or in combination with each other. In an embodiment, the pixel electrode PE may have a stacked structure including ITO/Ag/ITO. For example, the pixel electrode PE may operate as an anode.

The pixel defining layer PDL may be disposed on the via insulating layer VIA. The pixel defining layer PDL may cover both side portions of the pixel electrode PE. In addition, an opening exposing a portion of the upper surface of the pixel electrode PE may be defined in the pixel defining layer PDL.

For example, the pixel defining layer PDL may include an inorganic material or an organic material. In an embodiment, the pixel defining layer PDL may include an organic material such as an epoxy resin, a siloxane resin, and the like. These materials may be used alone or in combination with each other. In another embodiment, the pixel defining layer PDL may further include a light blocking material containing a black pigment, a black dye, and the like.

The light emitting layer EML may be disposed on the pixel electrode PE. The light emitting layer EML may include an organic material that emits light of a predetermined color. For example, the light emitting layer EML may include an organic material that emits red light. However, the present disclosure is not limited thereto, and the light emitting layer EML may emit light of a different color from red light.

The common electrode CE may be disposed on the light emitting layer EML and the pixel defining layer PDL. The common electrode CE may include a metal, an alloy, a metal nitride, a conductive metal oxide, a transparent conductive material, or the like. These materials may be used alone or in combination with each other. The common electrode CE may operate as a cathode.

The encapsulation layer TFE may be disposed on the common electrode CE. The encapsulation layer TFE may prevent impurities and moisture from penetrating into the pixel electrode PE, the light emitting layer EML, and the common electrode CE from the outside. The encapsulation layer TFE may include at least one inorganic layer and at least one organic layer.

For example, the inorganic layer may include silicon oxide, silicon nitride, silicon oxynitride, and the like. These materials may be used alone or in combination with each other. The organic layer may include a polymer cured product such as polyacrylate.

Although an exemplary embodiment of the display unit P has been described with reference to FIG. 4, the display unit P is not limited to the structure shown in FIG. 4. That is, the display unit P may include all structures that receive an electrical signal and emit light having a luminance corresponding to the intensity of the electrical signal.

Figure 5:
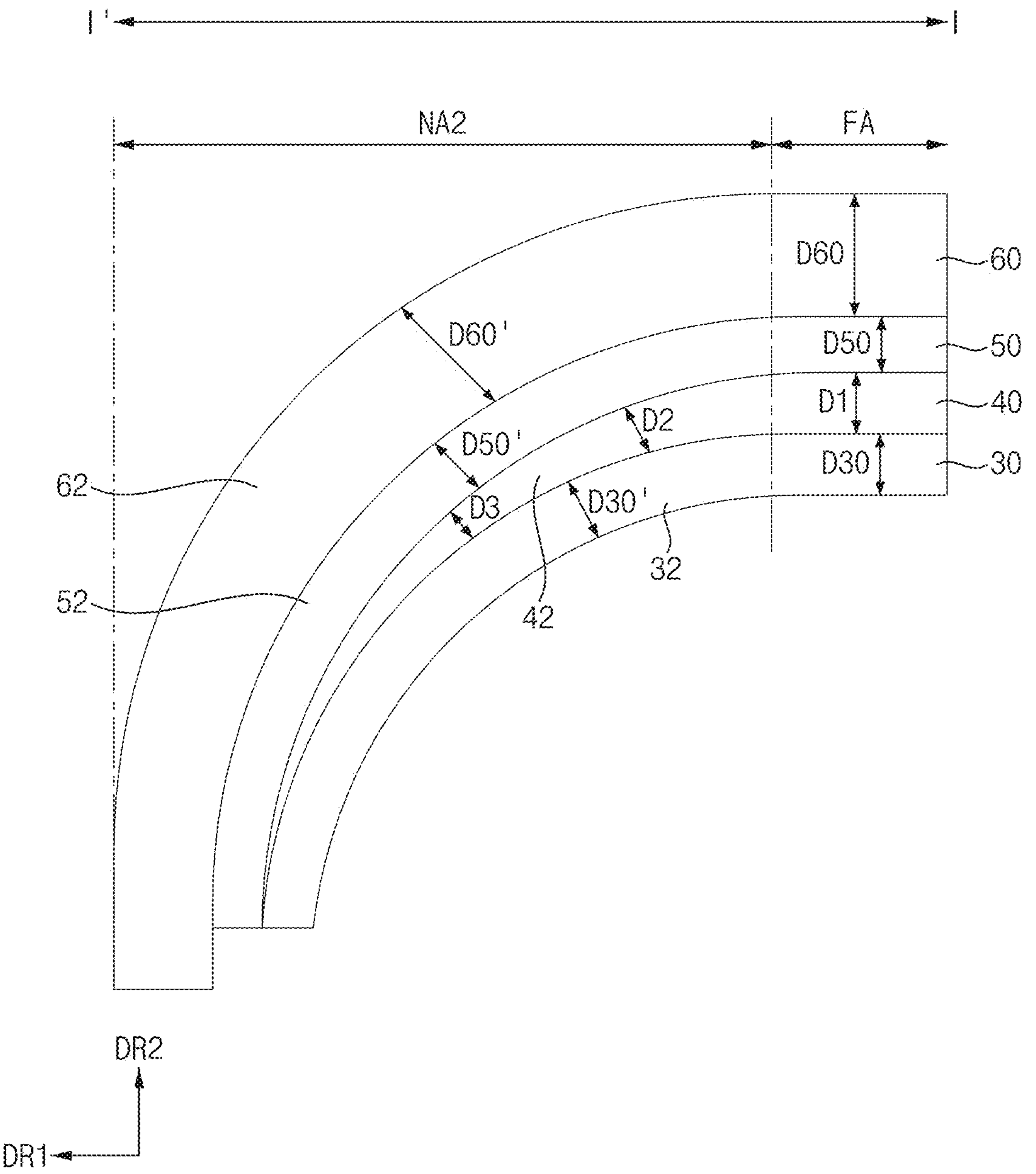
FIG. 5 is a schematic cross-sectional view of the display device of FIG. 1 taken along line I-I' of FIG. 1.
Figure 6:
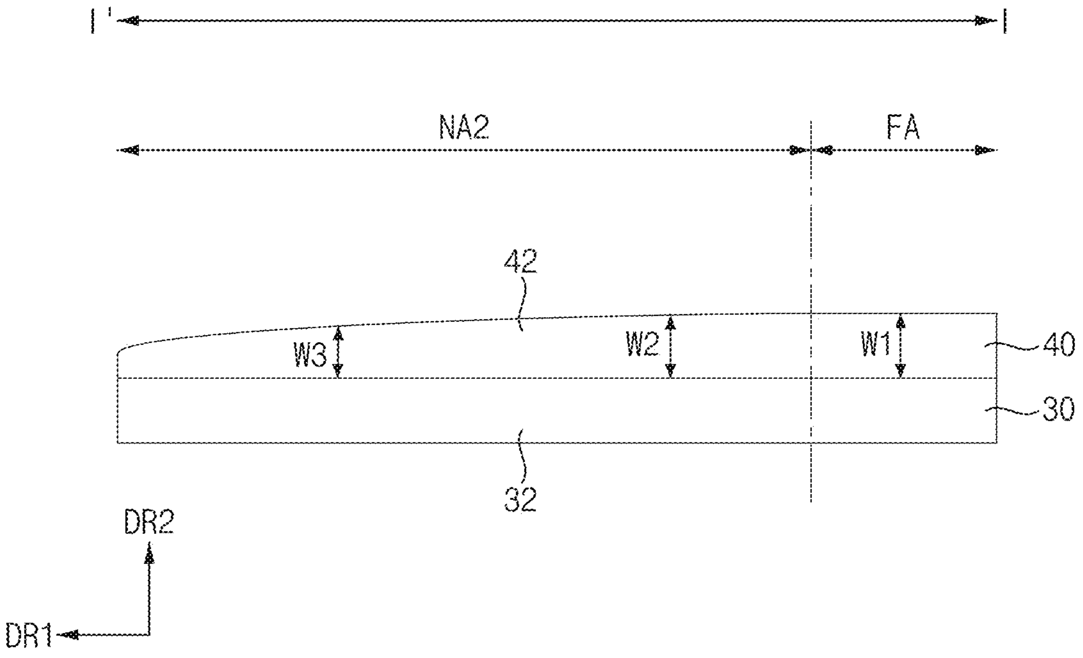
FIG. 6 is a schematic cross-sectional view illustrating a display panel and a transparent layer of FIG. 5 before a lamination process.

FIG. 5 is a schematic cross-sectional view of the display device of FIG. 1 taken along line I-I'. Specifically, FIG. 5 is a schematic cross-sectional view illustrating only configurations of an X-X' portion of the display device of FIG. 2 after the lamination process. FIG. 6 is a schematic cross-sectional view illustrating a display panel and a transparent layer of FIG. 5 before a lamination process.

Referring to FIGS. 2, 3, and 5, the first side area NA1, the second side area NA2, the third side area NA3, and the fourth side area NA4 of the display device 1000 may have the same structure. The second side area NA2 will be described with reference to FIG. 5, and descriptions of the remaining side areas NA1, NA3, and NA4 will be omitted.

A thickness D30 of the panel front part 30 may be constant over the front area FA. In addition, a thickness D30' of the second panel side part 32 may be constant over the second side area NA2. In an embodiment, the thickness D30 of the panel front part 30 and the thickness D30' of the second panel side part 32 may be the same.

A thickness D1 of the transparent layer front part 40 may be constant over the front area FA. A thickness D2 of a first portion of the first transparent layer's second side part 42 may be smaller than the thickness D1 of the transparent layer front part 40. In addition, a thickness D3 of a second portion of the first transparent layer's second side part 42 may be smaller than the thickness D2 of the first portion of the first transparent layer's second side part 42.

The first portion of the first transparent layer's second side part 42 may be closer to a boundary between the second side area NA2 and the front area FA than the second portion of the first transparent layer's second side part 42. That is, a thickness of the first transparent layer's second side part 42 may decrease in a direction away from the boundary between the second side area NA2 and the front area FA as shown in FIG. 5.

Accordingly, a curvature of the second panel side part 32 may be smaller than a curvature of the second adhesive layer's second side part 52 and a curvature of the second window side part 62. Accordingly, during the lamination process, a bending stress of the second side area NA2 of the display panel 300 may be reduced. That is, a bending stress occurring when the display panel 300 is compressed with the window 600 through the lamination process may be reduced. Accordingly, a crack, buckling, or wrinkling phenomenon may be effectively prevented.

In addition, the transparent layer 400 may protect the display panel 300 from external impact. That is, since the transparent layer 400 is disposed on the display panel 300, an impact applied to the display panel 300 from the outside may be reduced.

In addition, the transparent layer 400 may adjust a position of a neutral plane of the display device 1000. When the display device 1000 is folded or bent, tensile stress may be generated on one side with the neutral surface as a boundary, and compressive stress may be generated on the other side. The tensile stress and/or the compressive stress may not be generated in the neutral plane (or significantly smaller tensile stress and/or compressive stress than the tensile stress and/or the compressive stress of each of the one side and the other side may be generated). Since the transparent layer 400 is disposed on the display panel 300, the position of the neutral plane may be closer to the display panel 300. Specifically, the position of the neutral plane may rise (i.e., the second direction DR2). Accordingly, the position of the neutral plane may be closer to the display panel 300. Accordingly, the tensile stress and/or the compressive stress applied to the display panel 300 may be reduced.

In an embodiment, the thickness D1 of the transparent layer front part 40 may be about 30 micrometers (μm) or more and about 180 micrometers or less. When the thickness D1 of the transparent layer front part 40 is less than about 30 micrometers, an effect of protecting the display panel 300 by the transparent layer 400 may be reduced. That is, the external impact applied to the display panel 300 may not be reduced or may be slightly reduced.

Conversely, when the thickness D1 of the transparent layer front part 40 is greater than about 180 micrometers, the position of the neutral plane may be placed on an upper part of the display panel 300. That is, the display panel 300 may be separated from the neutral surface. Accordingly, the tensile stress and/or the compressive stress applied to the display panel 300 may increase.

In an embodiment, the transparent layer 400 may have a modulus of about 1 gigapascal (Gpa) or more and about 5 gigapascals or less. When the modulus of the transparent layer 400 is less than about 1 gigapascal, deformation of the transparent layer 400 may be excessively free. In this case, it may be difficult to protect the display panel 300 from external impact.

Conversely, when the modulus of the transparent layer 400 is greater than about 5 gigapascals, deformation of the transparent layer 400 may not be free. In this case, when the compressive stress is applied to the transparent layer 400, the transparent layer 400 may be distorted and wrinkles may occur.

A thickness D50 of the second adhesive layer's front part 50 may be constant over the front area FA. A thickness D50' of the second adhesive layer's second side part 52 may be constant over the second side area NA2. In an embodiment, the thickness D50' of the second adhesive layer's second side part 52 may be the same as the thickness D50 of the second adhesive layer's front part 50. In an embodiment, each of the thickness D50 of the second adhesive layer's front part 50 and the thickness D50' of the second adhesive layer's second side part 52 may be about 200 micrometers or more.

A thickness D60 of the window front part 60 may be constant over the front area FA. A thickness D60' of the second window side part 62 may be constant over the second side area NA2. In an embodiment, the thickness D60' of the second window side part 62 may be the same as the thickness D60 of the window front part 60.

Referring to FIGS. 3 and 6, a transparent layer 400 may be disposed on the display panel 300 before the lamination process. In an embodiment, the transparent layer 400 may be disposed on the display panel 300 through an inkjet process. Before the lamination process, a thickness W1 of the transparent layer front part 40 may be constant over the front area FA.

Before the lamination process, a thickness W2 of a first portion of the first transparent layer's second side part 42 may be smaller than the thickness W1 of the transparent layer front part 40. In addition, a thickness W3 of a second portion of the first transparent layer's second side part 42 may be smaller than the thickness W2 of the first portion of the first transparent layer's second side part 42.

The first portion of the first transparent layer's second side part 42 may be closer to a boundary between the second side area NA2 and the front area FA than the second portion of the first transparent layer's second side part 42. That is, a thickness of the first transparent layer's second side part 42 may decrease in a direction away from the boundary between the second side area NA2 and the front area FA.

Figure 7:
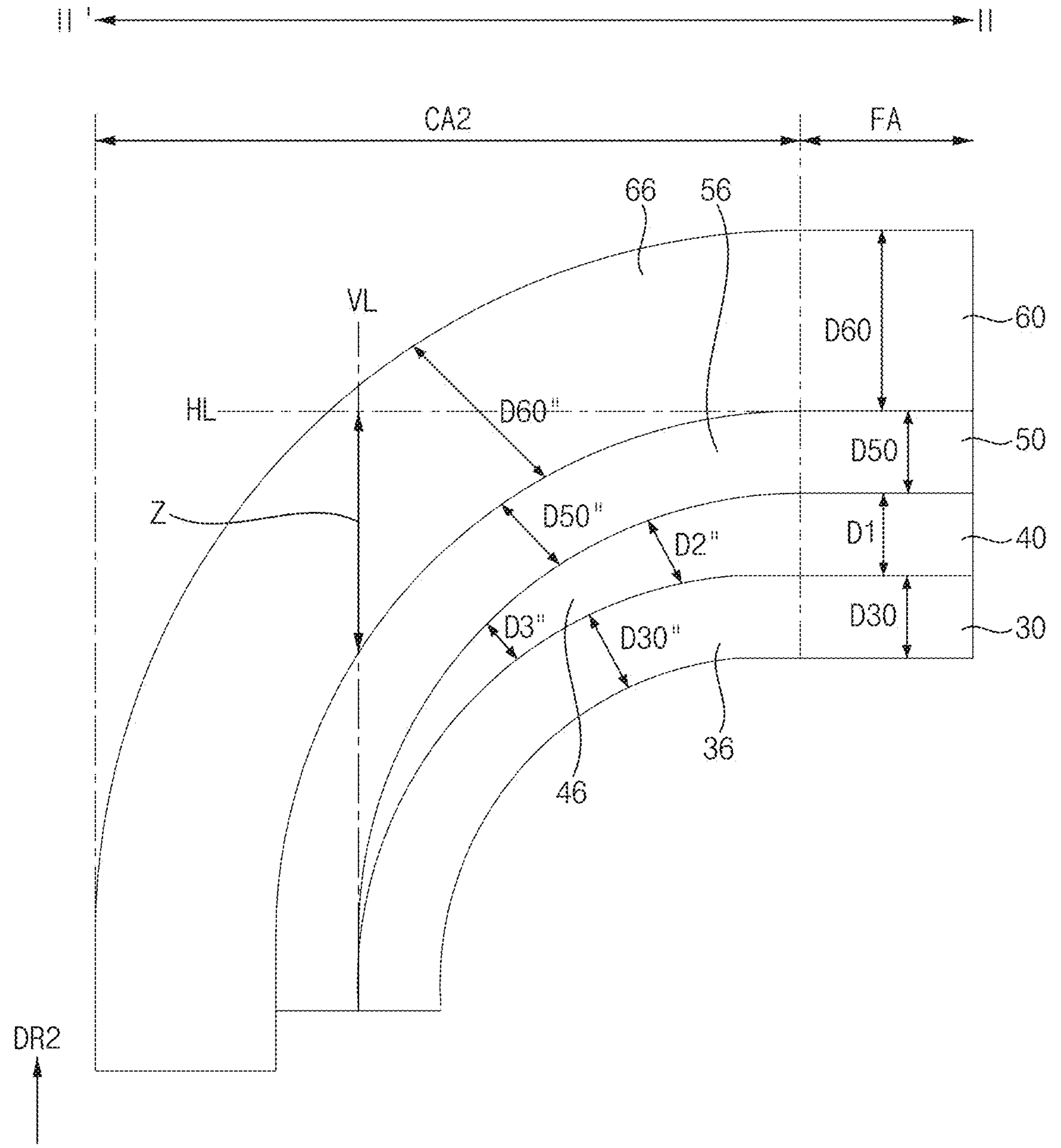
FIG. 7 is a schematic cross-sectional view of the display device of FIG. 1 taken along line II-II'.

FIG. 7 is a schematic cross-sectional view of the display device of FIG. 1 taken along line II-II'. Specifically, FIG. 7 is a schematic cross-sectional view illustrating only a configuration of an X-X' portion of the display device of FIG. 2.

Referring to FIGS. 3 and 7, the first corner area CA1, the second corner area CA2, the third corner area CA3, and the fourth corner area CA4 of the display device 1000 may have the same structure. The second corner area CA2 will be described with reference to FIG. 7, and descriptions of the remaining corner areas CA1, CA3, and CA4 will be omitted.

A thickness D30" of the second panel corner part 36 may be constant over the second corner area CA2. In an embodiment, the thickness D30" of the second panel corner part 36 and the thickness D30 of the panel front part 30 may be the same.

A thickness D2" of a first portion of the first transparent layer's second corner part 46 may be smaller than the thickness D1 of the transparent layer front part 40. In addition, a thickness D3" of a second portion of the first transparent layer's second corner part 46 may be smaller than the thickness D2" of the first portion of the first transparent layer's second corner part 46.

The first portion of the first transparent layer's second corner part 46 may be closer to a boundary between the second corner area CA2 and the front area FA than the second portion of the first transparent layer's second corner part 46. That is, a thickness of the first transparent layer's second corner part 46 may decrease in a direction away from the boundary between the second corner area CA2 and the front area FA.

A thickness D50" of the second adhesive layer's second corner part 56 may be constant over the second corner area CA2. In an embodiment, the thickness D50" of the second adhesive layer's second corner part 56 may be the same as the thickness D50 of the second adhesive layer's front part 50.

A thickness D60" of the second window corner part 66 may be constant over the second corner area CA2. In an embodiment, the thickness D60" of the second window corner part 66 may be the same as the thickness D60 of the window front part 60.

In an embodiment, a double curvature Z of the display panel 300 may be about 400 micrometers (μm) or more and about 1000 micrometers or less. Hereinafter, the double curvature Z may be defined.

A virtual vertical line VL may be disposed at an end portion of the first transparent layer's second corner part 46 in the second direction DR2. In addition, a virtual horizontal line HL extending from an upper surface of the second adhesive layer's front part 50 may be disposed. In this case, a distance between a point where a lower surface of the second window corner part 66 and the virtual vertical line VL meet and the point where the virtual vertical line VL and the virtual horizon HL meet may be defined as the double curvature Z.

The larger the double curvature Z of the display panel 300 is, the higher the frequency and/or strength of crack, buckling or wrinkling in the corner areas (e.g., the first corner area CA1, the second corner area CA2, the third corner area CA3, and the fourth corner area CA4) after the lamination process is. In other words, in this invention, an effect that the bending stress of the display panel 300 can be reduced may be maximized in high double curvature of display panel 300, where the double curvature Z of the display panel 300 is about 400 micrometers or more. However, the disclosure is not limited thereto, and the disclosure may be applied to the display panel 300 having a double curvature Z in a different range.

A display device according to a comparative example may include a window, a second adhesive layer placed under the window, a display panel placed under the second adhesive layer, a first adhesive layer placed under the display panel, and a protective film placed under the first adhesive layer.

A thickness of the second adhesive layer's second corner part of the display device according to the comparative example may decrease in a direction away from a boundary between the second corner area CA2 and the front part FA. In this case, a shape of the second adhesive layer's second corner part may be deformed during a lamination process or the like. This may be because the second adhesive layer is in a liquid form. Therefore, crack, buckling, or wrinkling may not be prevented from occurring in the corner of the second panel.

In contrast, the thickness of the first transparent layer's second corner part 46 according to an embodiment may decrease in a direction away from the boundary between the second corner area CA2 and the front area FA. In this case, a shape of the first transparent layer's second corner part 46 may not be deformed during the lamination process or the like. Therefore, crack, buckling, or wrinkling may be effectively prevented from occurring in the second panel corner part 36.

Figure 8:
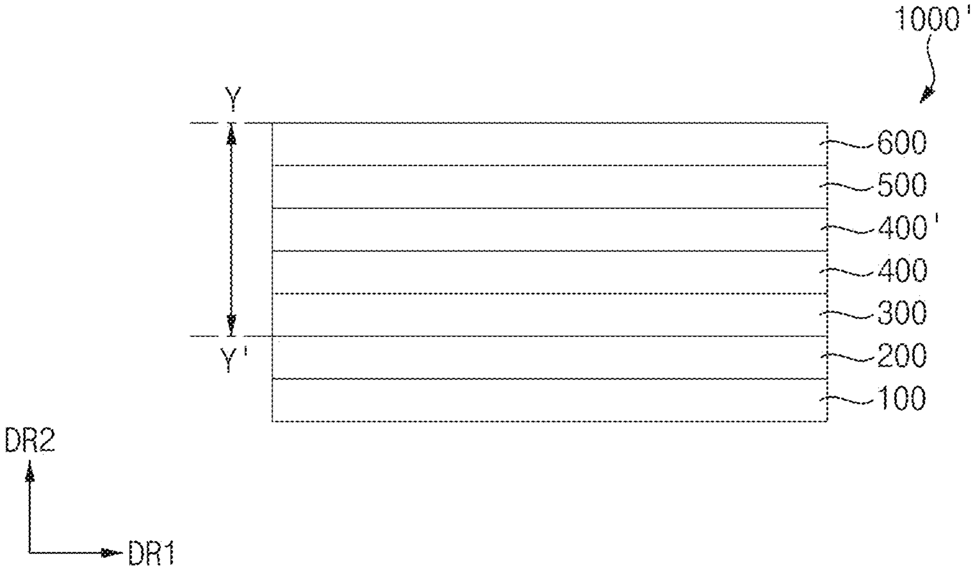
FIG. 8 is a view schematically illustrating a structure of a display device according to another embodiment.
Figure 9:
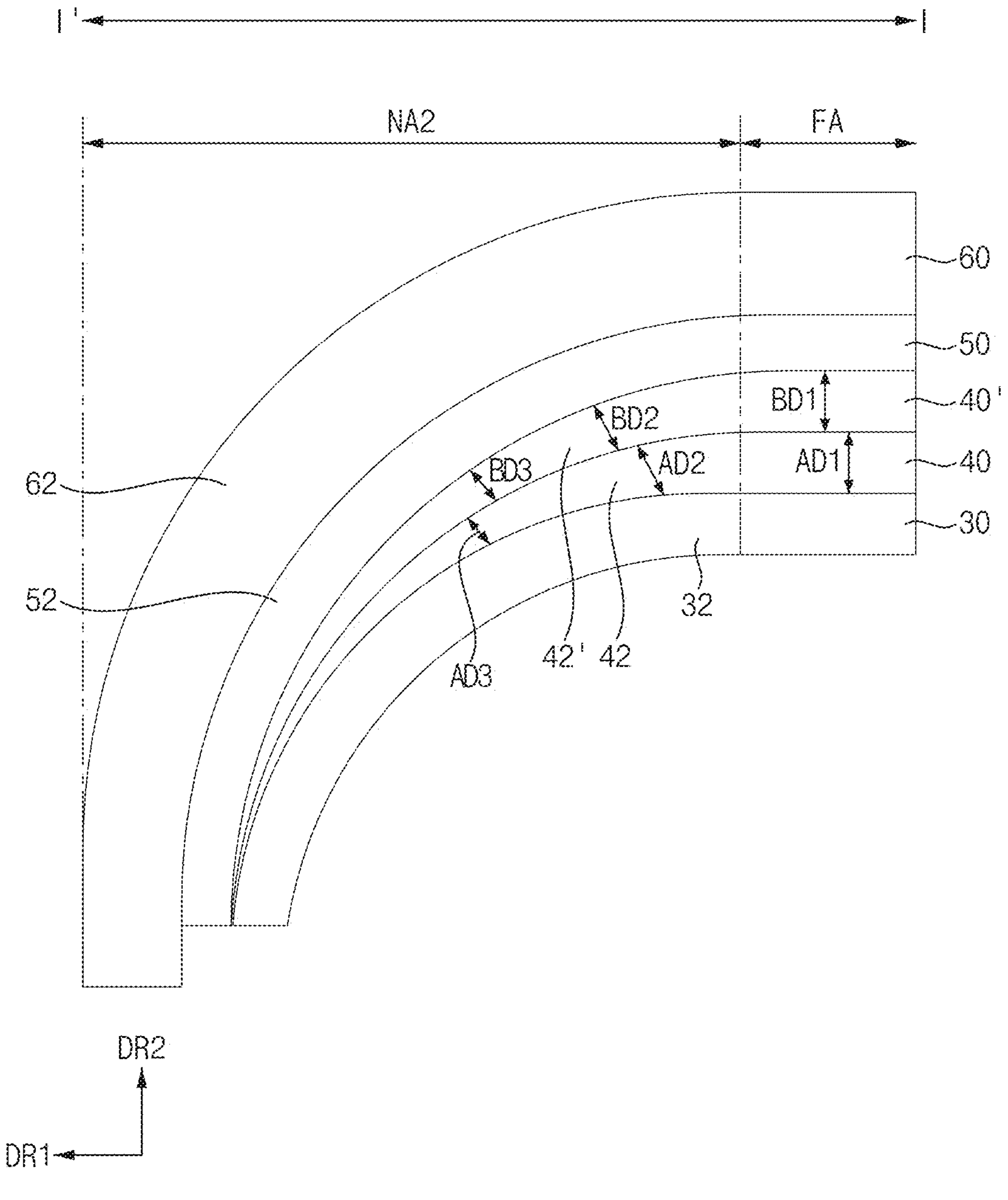
FIG. 9 is a schematic cross-sectional view of the display device of FIG. 8 taken along line I-I' of FIG. 1.
Figure 10:
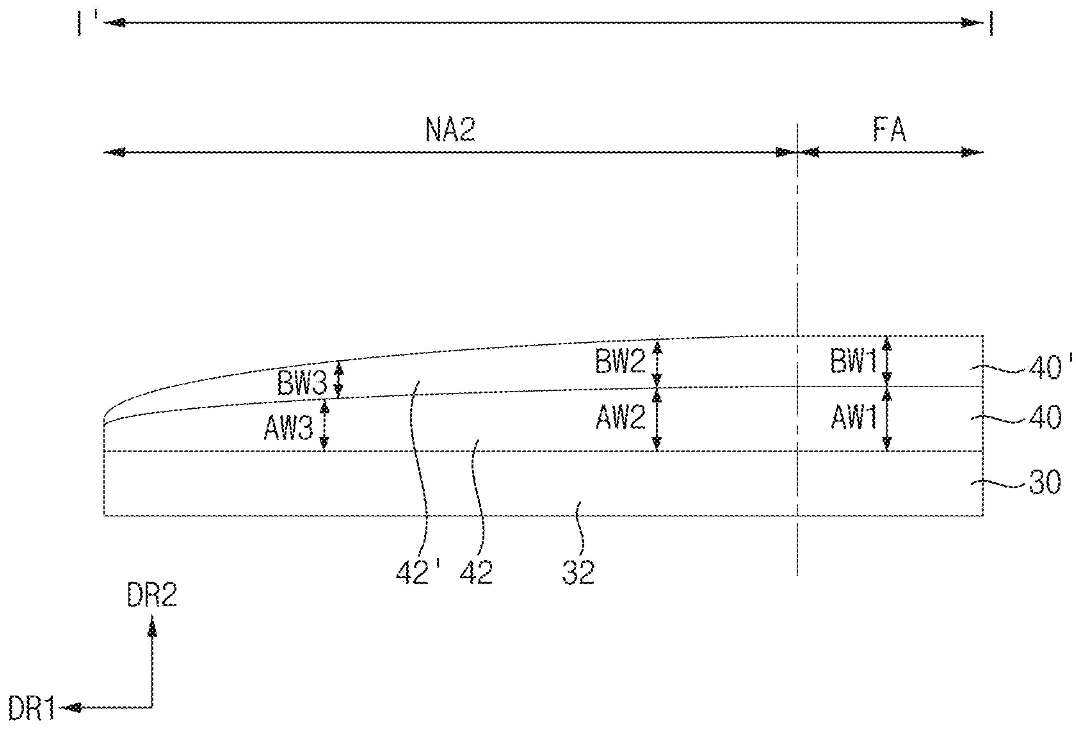
FIG. 10 is a schematic cross-sectional view illustrating a display panel and a transparent layers of FIG. 9 before the lamination process.
Figure 11:
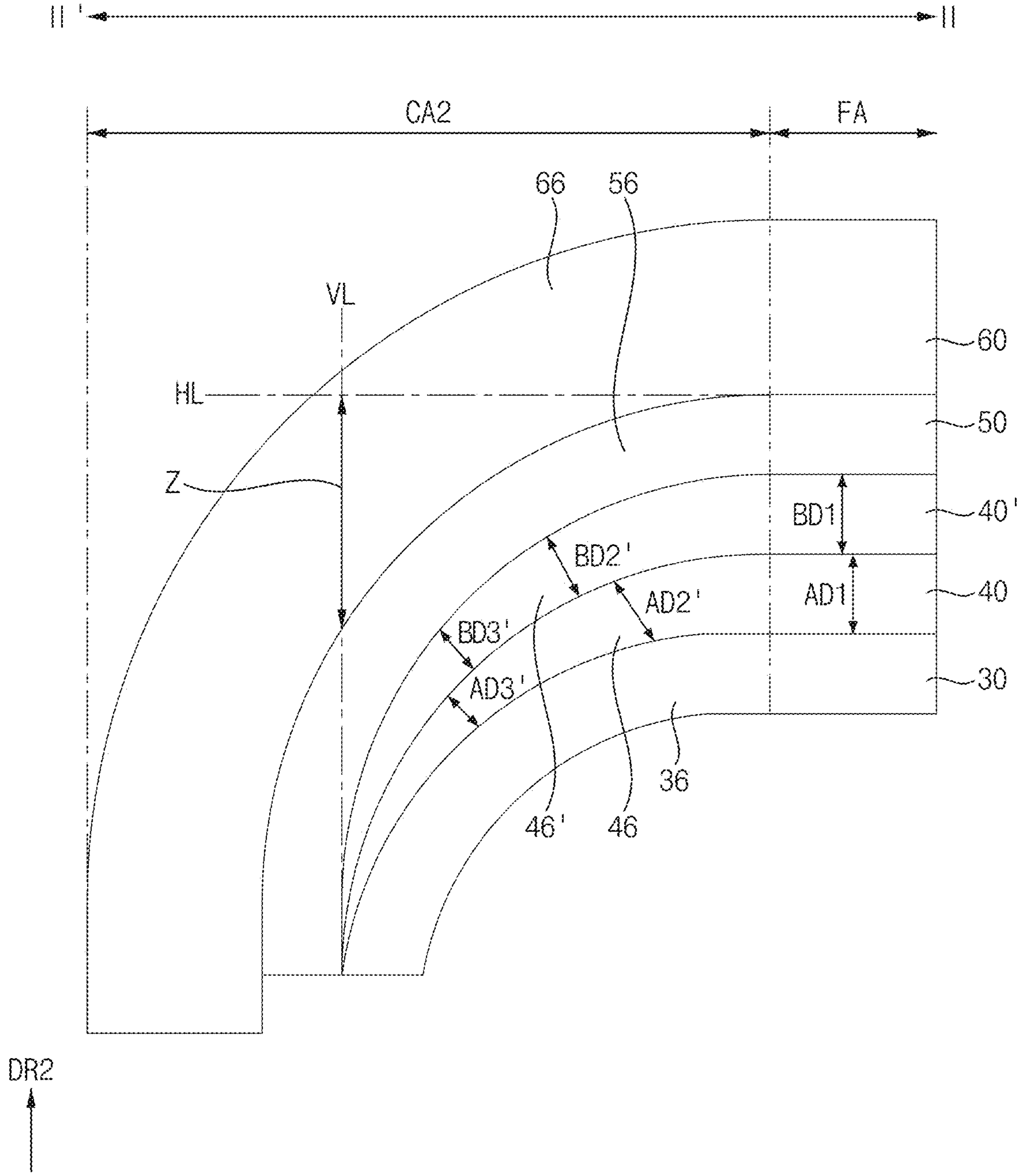
FIG. 11 is a schematic cross-sectional view of the display device of FIG. 8 cut along line II-II' of FIG. 1.

FIG. 8 is a view schematically illustrating a structure of a display device according to another embodiment. FIG. 9 is a schematic cross-sectional view of the display device of FIG. 8 taken along line I-I' of FIG. 1. Specifically, FIG. 9 is a schematic cross-sectional view illustrating only a configuration of a Y-Y' portion of the display device of FIG. 8 after the lamination process. FIG. 10 is a schematic cross-sectional view illustrating a display panel and a transparent layers of FIG. 9 before the lamination process. FIG. 11 is a schematic cross-sectional view of the display device of FIG. 8 cut along line II-II' of FIG. 1.

In describing the display device 1000' of FIGS. 8 to 11, substantially the same elements as the display device 1000 according to an embodiment described before may be given a same sign, and the detailed description of the same element may be omitted.

Referring to FIG. 8, a display device 1000' according to another embodiment may include a protective film 100, a first adhesive layer 200, a display panel 300, a first transparent layer 400, a second transparent layer 400', a second adhesive layer 500, and a window 600. In this case, the transparent layer 400 of FIG. 2 and the first transparent layer 400 of FIG. 8 may have substantially the same configuration.

In an embodiment, the second transparent layer 400' may include a polyvinyl alcohol ("PVA")-based resin, polyacrylic acid, polyacrylamide, methylated melamine resin, or the like. These materials may be used alone or in combination. However, the disclosure is not limited thereto, and the second transparent layer 400' may include another type of curing resin.

Referring to FIGS. 1, 8, and 9, the first side area NA1, the second side area NA2, the third side area NA3, and the fourth side area NA4 of the display device 1000' according to another embodiment may have the same structure. The second side area NA2 will be described with reference to FIG. 9, and descriptions of the remaining side areas NA1, NA3, and NA4 will be omitted.

The first transparent layer 400 may include a first transparent layer front part 40 in a portion overlapping the front area FA of the display device 1000'. In addition, the first transparent layer 400 may include a first transparent layer's second side part 42 in a portion overlapping the second side area NA2 of the display device 1000'.

A thickness AD1 of the first transparent layer front part 40 may be constant over the front area FA. A thickness AD2 of a first portion of the first transparent layer's second side part 42 may be smaller than a thickness AD1 of the first transparent layer front part 40. In addition, a thickness AD3 of a second portion of the first transparent layer's second side part 42 may be smaller than the thickness AD2 of the first transparent layer's second side part 42.

The first portion of the first transparent layer's second side part 42 may be closer to a boundary between the second side area NA2 and the front area FA than the second portion of the first transparent layer's second side part 42. That is, a thickness of the first transparent layer's second side part 42 may decrease in a direction away from the boundary between the second side area NA2 and the front area FA.

A thickness BD1 of the second transparent layer's front part 40' may be constant over the front area FA. A thickness BD2 of a first portion of the second transparent layer's second side part 42' may be smaller than the thickness BD1 of the second transparent layer's front part 40'. In addition, a thickness BD3 of a second portion of the second transparent layer's second side part 42' may be smaller than the thickness BD2 of the first portion of the second transparent layer's second side part 42'.

The first portion of the second transparent layer's second side part 42' may be closer to a boundary between the second side area NA2 and the front area FA than the second portion of the second transparent layer's second side part 42'. That is, a thickness of the second transparent layer's second side part 42' may decrease in a direction away from the boundary between the second side area NA2 and the front area FA.

In an embodiment, the thickness AD1 of the first transparent layer front part 40 may be different from the thickness BD1 of the second transparent layer front part 40'. For example, the thickness BD1 of the second transparent layer front part 40' may be smaller than the thickness AD1 of the first transparent layer front part 40. However, this disclosure is not limited to this, and in other embodiments, the thickness AD1 of the first transparent layer front part 40 may be the same as the thickness BD1 of the second transparent layer front part 40'. In an embodiment, the thickness of the second transparent layer's second side part 42' may be different from the thickness of the first transparent layer's second side part 42 at the same/corresponding location.

Referring to FIGS. 8 and 10, the first transparent layer 400 may be disposed on the display panel 300 before the lamination process. In addition, the second transparent layer 400' may be disposed on the first transparent layer 400. In an embodiment, the first transparent layer 400 and the second transparent layer 400' may be disposed on the display panel 300 through an inkjet process.

Before the lamination process, a thickness AW1 of the first transparent layer front part 40, and a thickness BW1 of the second transparent layer front part 40' may be constant over the front area FA.

Before the lamination process, a thickness AW2 of a first portion of the first transparent layer's second side part 42 may be smaller than the thickness AW1 of the first transparent layer front part 40. In addition, a thickness AW3 of a second portion of the first transparent layer's second side part 42 may be smaller than the thickness AW2 of the first transparent layer's second side part 42.

The first portion of the first transparent layer's second side part 42 may be closer to a boundary between the second side area NA2 and the front area FA than the second portion of the first transparent layer's second side part 42. That is, a thickness of the first transparent layer's second side part 42 may decrease in a direction away from the boundary between the second side area NA2 and the front area FA.

A thickness BW2 of a first portion of the second transparent layer's second side part 42' may be smaller than the thickness BW1 of the second transparent layer front part 40'. In addition, a thickness BW3 of a second portion of the second transparent layer's second side part 42' may be smaller than the thickness BW2 of the first portion of the second transparent layer's second side part 42'.

The first portion of the second transparent layer's second side part 42' may be closer to a boundary between the second side area NA2 and the front area FA than the second portion of the second transparent layer's second side part 42'. That is, a thickness of the second transparent layer's second side part 42' may decrease in a direction away from the boundary between the second side area NA2 and the front area FA.

Referring to FIGS. 1, 8, and 11, the first corner area CA1, the second corner area CA2, the third corner area CA3, and the fourth corner area CA4 of display device 1000' according to another embodiment may have the same structure. The second corner area CA2 will be described with reference to FIG. 11, and descriptions of the remaining corner areas CA1, CA3, and CA4 will be omitted.

A thickness AD2' of a first portion of the first transparent layer's second corner part 46 may be smaller than a thickness AD1 of the first transparent layer front part 40. In addition, a thickness AD3' of a second portion of the first transparent layer's second corner part 46 may be smaller than the thickness AD2' of the first transparent layer's second corner part 46.

The first portion of the first transparent layer's second corner part 46 may be closer to a boundary between the second corner area CA2 and the front area FA than the second portion of the first transparent layer's second corner part 46. That is, a thickness of the first transparent layer's second corner part 46 may decrease in a direction away from the boundary between the second corner area CA2 and the front area FA.

A thickness BD2' of a first portion of the second transparent layer's second corner part 46' may be smaller than a thickness BD1 of the second transparent layer front part 40'. In addition, a thickness BD3' of a second portion of the second transparent layer's second corner part 46' may be smaller than the thickness BD2' of the first portion of the second transparent layer's second corner part 46'.

The first portion of the second transparent layer's second corner part 46' may be closer to a boundary between the second corner area CA2 and the front area FA than the second portion of the second transparent layer's second corner part 46'. That is, a thickness of the second transparent layer's second corner part 46' may decrease in a direction away from the boundary between the second corner area CA2 and the front area FA.

In an embodiment, a double curvature Z of the display panel 300 may be about 400 micrometers (μm) or more and about 1000 micrometers or less. Hereinafter, the double curvature Z may be defined.

A virtual vertical line VL may be disposed at an end portion of the second transparent layer's second corner part 46' in the second direction DR2. In addition, a virtual horizontal line HL extending from an upper surface of the second adhesive layer's front part 50 may be disposed. In this case, a distance between a point where a lower surface of the second window corner part 66 and the virtual vertical line VL meet and the point where the virtual vertical line VL and the virtual horizon HL meet may be defined as the double curvature Z.

FIGS. 8 to 11 may illustrate an embodiment in which the display device 1000' may include a first transparent layer 400 and a second transparent layer 400' disposed on the first transparent layer 400. However, the disclosure is not limited thereto, and the display device 1000' may include three or more transparent layers. For example, a third transparent layer may be disposed on the second transparent layer 400'. In an embodiment, the third transparent layer may include a flat surface on the front area and a curved surface on each of the side areas, and the third transparent layer may have a thickness on each of the side areas different from a thickness on the front area.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:

a display panel including a front area having a flat surface, side areas having curved surfaces, and corner areas located between two adjacent side areas among the side areas, respectively; and a first transparent layer disposed on the display panel and including a flat surface on the front area and a curved surface on each of the side areas, wherein the first transparent layer has a thickness on each of the side areas different from a thickness on the front area-, wherein a double curvature of the display panel in each of the corner areas is equal to or greater than about 400 micrometers (μm) and equal to or less than about 1000 micrometers.

2. The display device of claim 1, wherein the thickness of the first transparent layer on each of the side areas gradually decreases in a direction away from a boundary of the first transparent layer between each of the side areas and the front area.

3. The display device of claim 1, wherein the first transparent layer includes a cured resin.

4. The display device of claim 3, wherein the first transparent layer includes at least one selected from a group consisting of a polyvinyl alcohol (PVA)-based resin, polyacrylic acid, polyacrylamide, and a methylated melamine resin.

5. The display device of claim 1, further comprising a protective film disposed under the display panel and including a flat surface under the front area and a curved surface under each of the side areas.

6. The display device of claim 5, further comprising a first adhesive layer disposed between the protective film and the display panel and including a flat surface under the front area and a curved surface under each of the side areas.

7. The display device of claim 1, further comprising a window disposed on the first transparent layer and including a flat surface on the front area and a curved surface on each of the side areas.

8. The display device of claim 7, further comprising a second adhesive layer disposed between the first transparent layer and the window and including a flat surface on the front area and a curved surface on each of the side areas.

9. The display device of claim 1, wherein the thickness of the first transparent layer on the front area is equal to or greater than about 30 micrometers and equal to or less than about 180 micrometers.

10. The display device of claim 1, wherein the first transparent layer has a modulus equal to or greater than about 1 gigapascal (Gpa) and equal to or less than about 5 gigapascals.

11. The display device of claim 1, further comprising a second transparent layer disposed on the first transparent layer and including a flat surface on the front area and a curved surface on each of the side areas, and the second transparent layer has a thickness on each of the side areas different from a thickness on the front area.

12. The display device of claim 11, wherein the thickness of the second transparent layer on each of the side areas gradually decreases in a direction away from a boundary of the second transparent layer between each of the side areas and the front area.

13. The display device of claim 11, wherein the second transparent layer includes a cured resin.

14. The display device of claim 13, wherein the second transparent layer includes at least one selected from a group consisting of a polyvinyl alcohol (PVA)-based resin, polyacrylic acid, polyacrylamide, and a methylated melamine resin.

15. The display device of claim 11, wherein the second transparent layer has a modulus equal to or greater than about 1 gigapascal (Gpa) and equal to or less than about 5 gigapascals.

16. The display device of claim 11, wherein the thickness of the second transparent layer on the front area is different from the thickness of the first transparent layer on the front area.

17. The display device of claim 16, wherein the thickness of the second transparent layer on the front area is smaller than the thickness of the first transparent layer on the front area.

18. The display device of claim 11, further comprising a third transparent layer disposed on the second transparent layer and including a flat surface on the front area and a curved surface on each of the side areas, wherein the third transparent layer has a thickness on each of the side areas different from a thickness on the front area.

19. The display device of claim 18, wherein the thickness of the third transparent layer on each of the side areas gradually decreases in a direction away from a boundary of the third transparent layer between each of the side areas and the front area.

* * * * *